United States Patent
Miyajima et al.

(10) Patent No.: US 6,748,651 B2
(45) Date of Patent: Jun. 15, 2004

(54) METHOD OF MANUFACTURING A BUS-BAR WIRING BOARD TO REDUCE THE AMOUNT OF WASTE

(75) Inventors: Kazuo Miyajima, Shiga (JP); Shin Hasegawa, Shiga (JP); Yoshiaki Sawaki, Shiga (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/818,521

(22) Filed: Mar. 28, 2001

(65) Prior Publication Data

US 2001/0012736 A1 Aug. 9, 2001

Related U.S. Application Data (62) Division of application No. 09/367,537, filed as application No. PCT/JP98/05488 on Dec. 4, 1998, now Pat. No. 6,433,281.

(30) Foreign Application Priority Data

Dec. 18, 1997 (JP) .............................................. 9-349631

(51) Int. Cl.⁷ .............................. H01R 9/00; H05K 3/00
(52) U.S. Cl. .............................. 29/845; 29/825; 29/831; 29/827; 29/844; 29/845; 29/432; 29/437; 29/505; 174/70 B; 174/71 B; 174/72 B; 174/99 B; 174/68.2; 174/149 B; 174/267; 361/775; 439/76.2; 439/949
(58) Field of Search ........................ 29/825, 827, 830, 29/831, 832, 844, 845, 846, 854, 432, 437, 448, 505; 174/70 B, 71 B, 72 B, 250, 99 B, 68.2, 149 B, 267; 361/775; 439/76.2, 949

(56) References Cited

U.S. PATENT DOCUMENTS

| | | | | |
|---|---|---|---|---|
| 3,742,589 A | * | 7/1973 | Andrae et al. ................. | 29/827 |
| 4,658,502 A | * | 4/1987 | Eckold et al. ................. | 29/21.1 |
| 5,530,625 A | | 6/1996 | VanDerStuyf et al. ...... | 361/794 |

FOREIGN PATENT DOCUMENTS

| | | |
|---|---|---|
| FR | 2 758 659 A | 7/1998 |
| JP | 63-174511 | 7/1988 |
| JP | 64-64521 | 3/1989 |
| JP | 2-95185 | 7/1990 |
| JP | 03 150014 | 6/1991 |
| JP | 4 58032 | 5/1992 |
| JP | 08 111250 | 4/1996 |

\* cited by examiner

Primary Examiner—Richard Chang
(74) Attorney, Agent, or Firm—Westerman, Hattori, Daniels & Adrian LLP (57) ABSTRACT

This method includes punching a bus-bar pattern out of a conductive metal sheet. A bus bar terminal piece is punched out of the remaining material in the conductive metal sheet. An electrical connection is formed between the bus-bar pattern and the bus-bar terminal piece using male and female connections.

3 Claims, 7 Drawing Sheets

METHOD OF MANUFACTURING A BUS-BAR WIRING BOARD TO REDUCE THE AMOUNT OF WASTE

This application is a divisional application of prior application Ser. No. 09/367,537 filed Oct. 15, 1999, now U.S. Pat. No. 6,433,281 which is a 371 of PCT/JP98/05488 filed Dec. 4, 1998.

TECHNICAL FIELD

The present invention relates to a bus-bar wiring board assembled in an electric connection box etc. installed in an automobile or other vehicle.

BACKGROUND ART

A bus-bar wiring board assembled in an electric connection box etc. installed in an automobile or other vehicle has conventionally been produced by punching out a bus-bar pattern for use as electric wiring from a conductive metal sheet by a forwarding press one pattern at a time. For example, as shown in FIG. 1, a bus-bar pattern 2 laid out in a predetermined shape is punched out from a conductive metal sheet 1 having a width W.

The bus-bar pattern 2 includes bus-bars for a plurality of circuits and is punched out in a state connected by bridges 3 at different positions so that the plurality of circuits do not come apart after being punched out. The bridges 3 are cut after the bus-bar pattern 2 is stacked on an insulating board so as to separate the bus-bar pattern 2 into the bus-bars of the respective circuits. The portions of the tabs 4 are perpendicularly bent at the positions of the broken lines to stand upright prior to the pattern being stacked on the insulating board.

The above bus-bar pattern 2 is normally formed to a contour to fit in the surrounding walls of a case of the electric connection box, but in the case of a ground circuit etc., for grounding to the chassis, a projecting terminal piece 5 is provided projecting from the surrounding walls of the case of the electric connection box to the outside in some cases.

Figure 1:
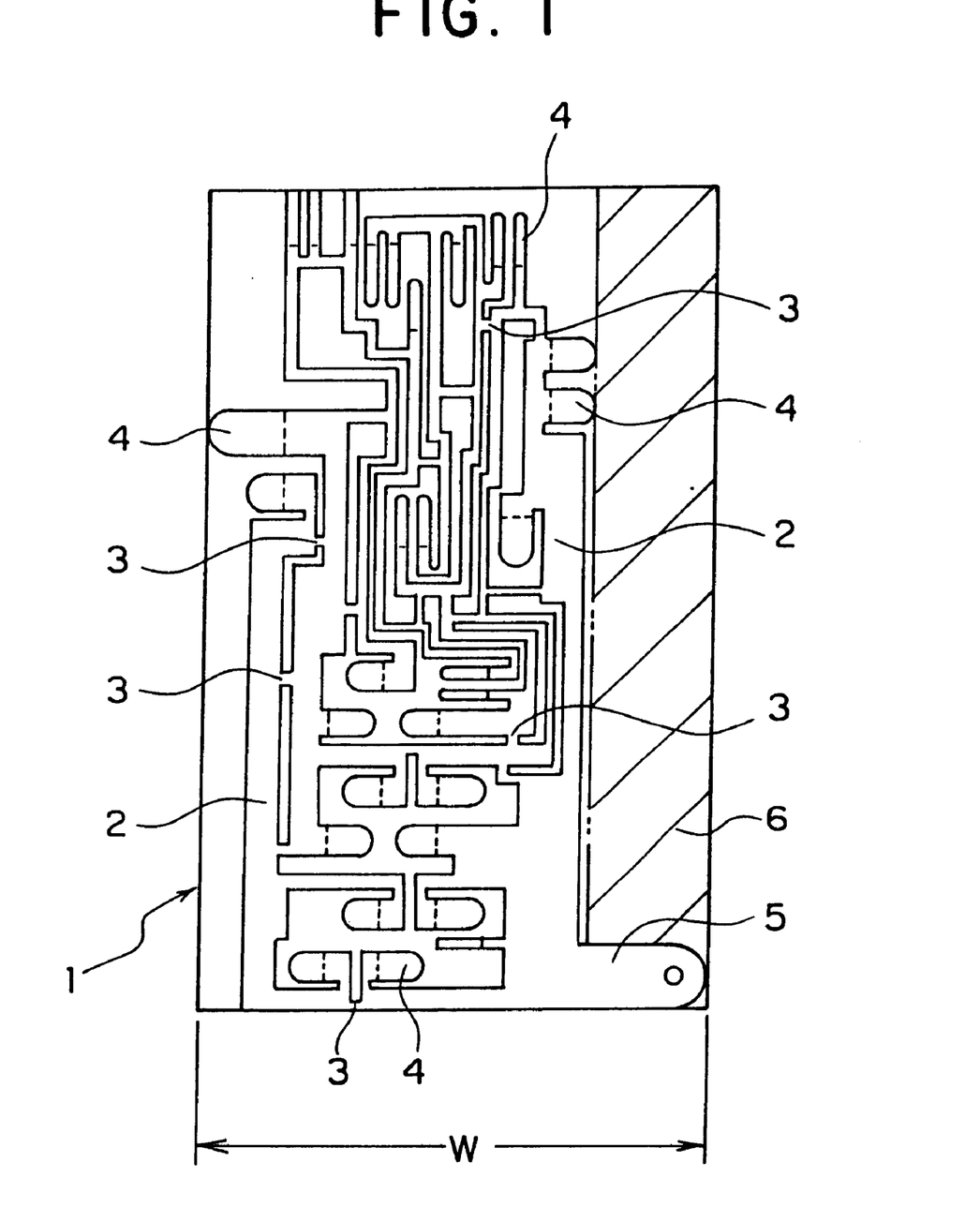
FIG. 1 is a plan view of a layout when punching out a bus-bar pattern from a conductive metal sheet by a conventional production method.

In such a case, in the past, since the projecting terminal piece 5 and the bus-bar pattern 2 were punched out as one piece from the conductive metal sheet 1, as shown in FIG. 1, there was the problem that large material scraps 6 (hatched portion) were generated from the conductive metal sheet 1 and the conductive metal sheet could not be effectively used.

DISCLOSURE OF INVENTION

An object of the present invention is to provide a bus-bar wiring board which can reduce waste by effectively using a conductive metal sheet and can reduce the production costs.

Another object of the present invention is to provide a method of producing a bus-bar wiring board which can reduce waste by effectively using a conductive metal sheet and can reduce the production costs.

A bus-bar wiring board of the present invention comprises a bus-bar pattern for electric wiring formed to a predetermined shape and a bus-bar piece separately formed from the bus-bar pattern and electrically connected and secured to the bus-bar pattern.

In the bus-bar wiring board of the above configuration, the above bus-bar pattern may have one of an integrally formed male projecting portion and female recessed portion, the bus-bar piece may have the other of the integrally formed male projecting portion and female recessed portion of a shape complementarily fitted with the one of the male projecting portion and female recessed portion formed in the bus-bar pattern, and the bus-bar piece may be secured to the bus-bar pattern by fitting the one of the male projecting portion and female recessed portion into the other.

Further, in the bus-bar wiring board of the above configuration, the one and the other of the male projecting portion and female recessed portion may be formed by press working.

The method of producing a bus-bar wiring board of the present invention includes a bus-bar pattern punching step for punching out a bus-bar pattern for electric wiring laid out to a predetermined shape from a conductive metal sheet; a bus-bar piece punching step for punching out a bus-bar piece laid out to a predetermined shape at a remaining space of the conductive metal sheet; and a connecting step for electrically connecting and securing the bus-bar pattern punched out by the bus-bar punching step and the bus-bar piece punched out by the bus-bar piece punching step.

In the method of production of the above configuration, the bus-bar piece punching step may be carried out simultaneously with the bus-bar pattern punching step.

Further, the method of production of the above configuration may further comprise a first fitting portion forming step for forming one of a male projecting portion and female recessed portion as a first fitting portion at the bus-bar pattern and a second fitting portion forming step for forming the other of the male projecting portion and female recessed portion as a second fitting portion complementarily fitting with the first fitting portion at the bus-bar piece, the first fitting portion and second fitting portion being connected and secured by press-fitting by a press in the connecting step.

Further, in the method of production of the above configuration, the first fitting portion forming step may be carried out simultaneously with the bus-bar pattern punching step and the second fitting portion forming step may be carried out simultaneously with the bus-bar piece punching step.

Further, in the method of production of the above configuration, in the connecting step, the bus-bar pattern and the bus-bar piece may superposed and recessed portions formed integrally by press-working to connect and secure the two.

Further, in the method of production of the above configuration, the bus-bar piece punching step may be carried out simultaneously with the bus-bar pattern punching step and, in the connecting step, the bus-bar pattern and the bus-bar piece may be superposed and recessed portions formed integrally by press-working to connect and secure the two.

BEST MODE FOR CARRYING OUT THE INVENTION

Below, preferred embodiments of the present invention will be explained based on the drawings.

Figure 2:
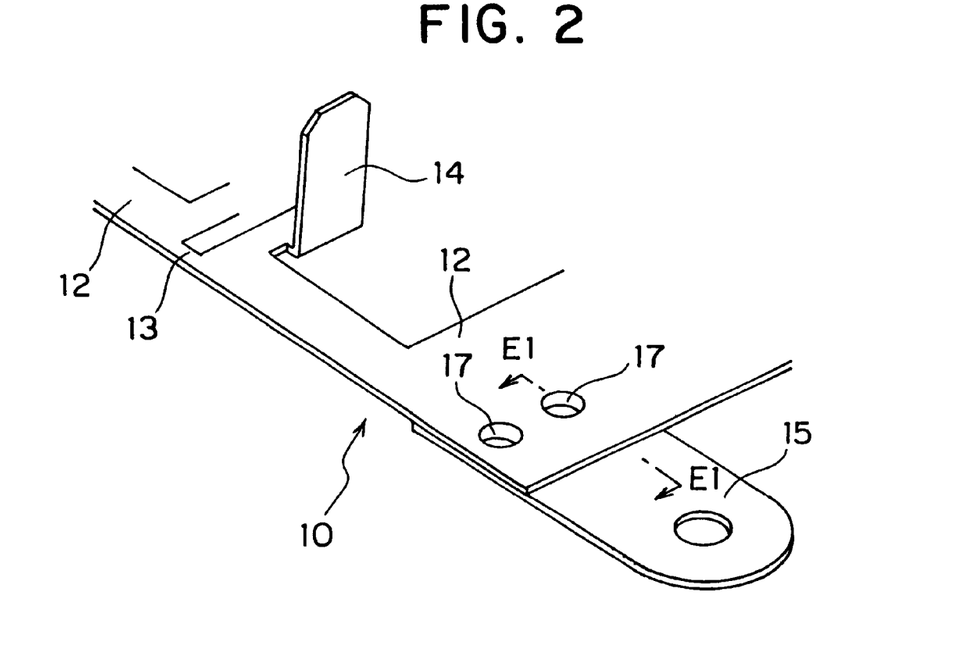
FIG. 2 is a perspective view of an embodiment of a bus-bar wiring board of the present invention.
Figure 3:
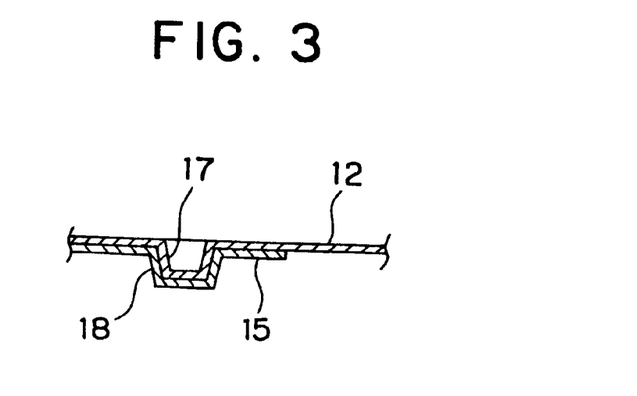
FIG. 3 is a sectional view along the line E1 to E1 in FIG. 2.

FIGS. 2 and 3 are a partial perspective view and a sectional view of an embodiment of a bus-bar wiring board according to the present invention. A bus-bar wiring board 10 according to the present embodiment comprises as its basic configuration, as shown in FIG. 2, a bus-bar pattern 12 formed to a predetermined shape for electric wiring and a bus-bar piece, for example, a bus-bar terminal piece 15, separately formed from the bus-bar pattern 12 and electrically connected and secured to the bus-bar pattern 12.

Here, the bus-pattern 12 may be formed as a single piece to form a predetermined electric circuit or may be composed of a plurality of electric circuits, that is, a plurality of bus-bars, formed as one piece by bridges 13 and used after cutting the bridges 13. Further, the bus-bar pattern 12 is formed with tabs 14 standing upright.

As shown in FIG. 3, the bus-bar pattern 12 has an integrally formed male projecting portion 17 as a first fitting portion, while the bus-bar terminal piece 15 has an integrally formed female recessed portion 18 as a second fitting portion of a shape complementarily fitting with the male projecting portion 17 formed on the bus-bar pattern 12. The bus-bar terminal piece 15 is electrically connected and mechanically secured to the bus-bar pattern 12 by press-fitting the male projecting portion 17 into the female recessed portion 18 by a press etc. Namely, the bus-bar terminal piece 15 is connected to the bus-bar pattern 12 by a TOX connection.

In the bus-bar wiring board 10 according to the present embodiment, a male projecting portion 17 was formed on the bus-bar pattern 12 and a female recessed portion 18 was formed on the bus-bar terminal piece 15, however, it is also possible to adopt a configuration where conversely the female recessed portion is formed on the bus-bar pattern 12 and the male projecting portion is formed on the bus-bar terminal piece 15.

Also, the male projecting portion 17 and the female recessed portion 18 are formed to have circular cross-sections by the press-working. The cross-sectional shapes, however, are not limited to circular shapes. The portions may be formed to cross-sectional shapes other than circular shapes such as substantially rectangular or substantially triangular shapes.

When using cross-sectional shapes other than circular shapes in this way, by just providing one TOX connection, it is possible to reliably prevent the bus-bar terminal piece 15 from rotating along the connecting surface of the bus-bar pattern 12 and to reliably connect and secure the bus-bar terminal piece 15 to a predetermined direction.

Next, a method of producing the bus-bar wiring board of the present invention will be explained.

Figure 4:
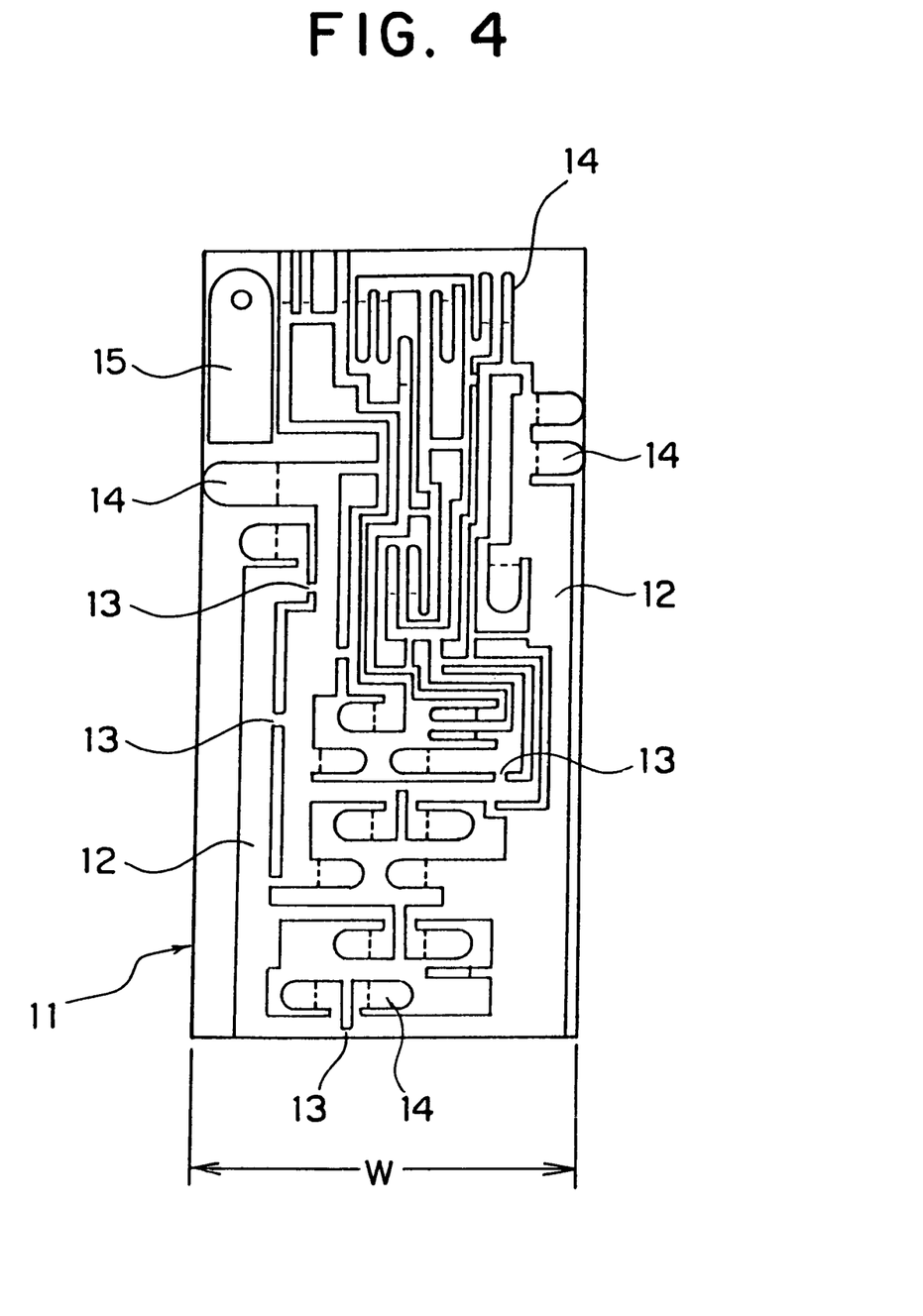
FIG. 4 is a plan view of an embodiment of the method of producing a bus-bar wiring board according to the present invention showing a layout when punching out a bus-bar pattern and a bus-bar piece from a conductive metal sheet.
Figure 5:
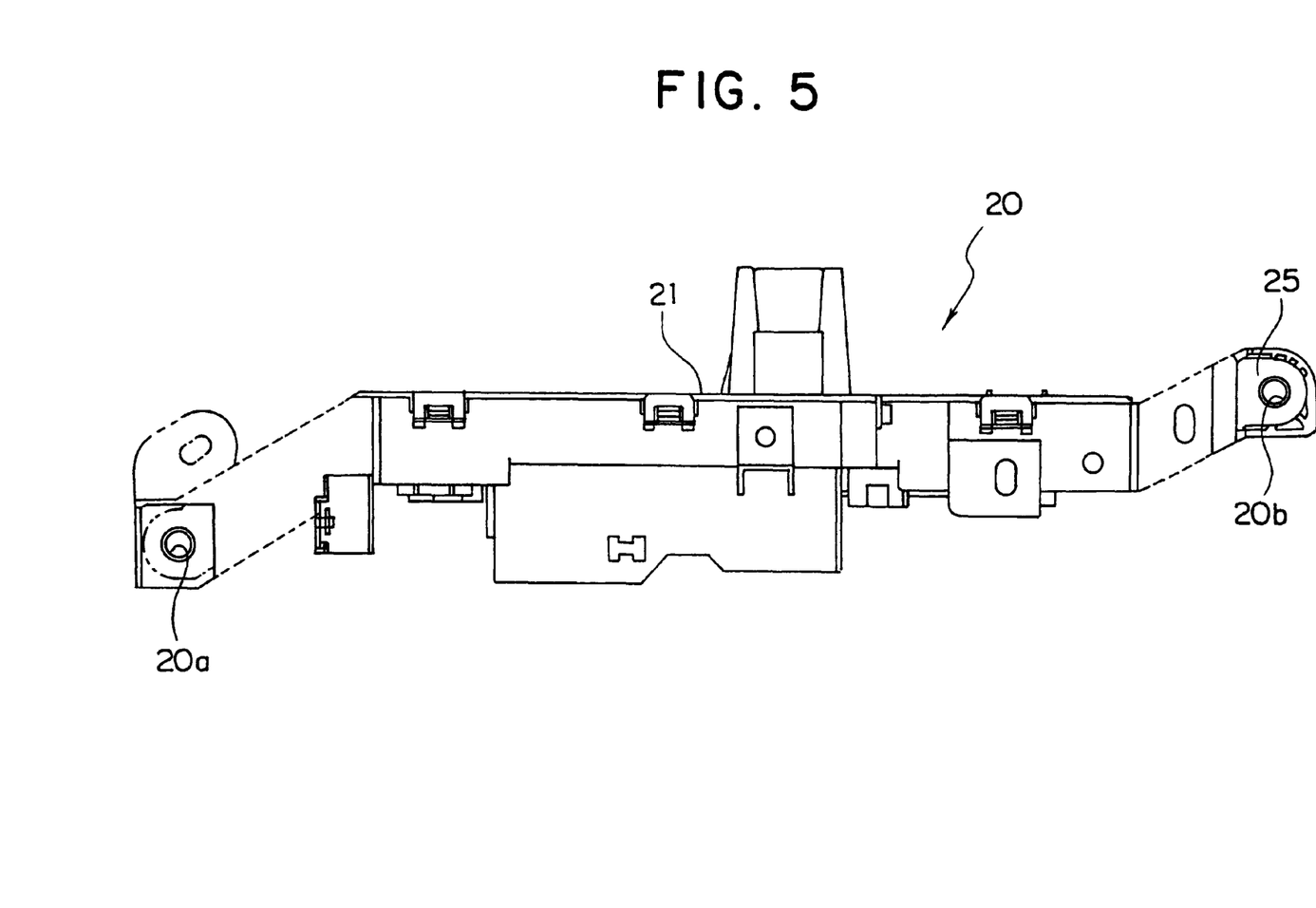
FIG. 5 is a front view of an electric connection box mounted in an automobile.
Figure 6:
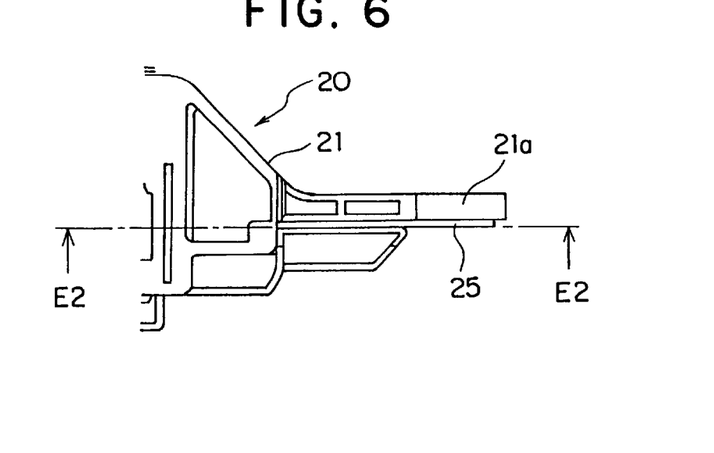
FIG. 6 is a partial enlarged front view of a part of a ground terminal portion of the electric connection box shown in FIG. 5.
Figure 7:
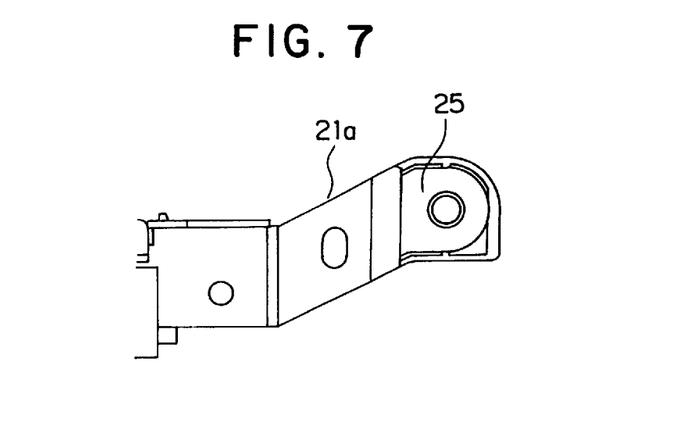
FIG. 7 is a bottom view of the ground terminal portion shown in FIG. 6.

First, as shown in FIG. 4, a bus-bar pattern 12 of a predetermined shape is laid out on a conductive metal sheet 11 made of, for example, copper or copper alloy, forming a substantially rectangular shape contour. A bus-bar terminal piece 15 of a predetermined shape, for example, an elongated shape, is laid out on the remaining vacant space.

Next, the conductive metal sheet 11 on which the above layout was performed is punched out by a press to punch out a bus-bar pattern 12 (bus-bar pattern punchout step) or punch out a bus-bar terminal piece 15 (bus-bar piece punchout step) and the bus-bar pattern 12 and the bus-bar terminal piece 15 are taken out.

The above punching out of the bus-bar pattern 12 and punching out of the bus-bar terminal piece 15 may be carried out by first punching out the bus-bar pattern 12 and then punching out the bus-bar terminal piece 15 or punching out the two simultaneously by a single step.

According to this method of production, by laying out the pieces so that the bus-bar terminal piece 15 does not project from the bus-bar pattern 12 in the punching process, a conductive metal sheet 11 having a narrower width W than the past can be used and less material scrap is generated, so production is possible at a low cost and is economical.

Subsequently, a male projecting portion 17 serving as a first fitting portion is formed by press-working at the bus-bar pattern 12 taken out by the above punching process (first fitting portion forming step) or a female recessed portion 18 serving as a second fitting portion is formed by press-working at the bus-bar terminal piece 15 taken out from the above punching process (second fitting portion forming step). Note that, in reverse from the present embodiment, the female recessed portion serving as the first fitting portion may be formed at the bus-bar pattern 12, while the male projecting portion serving as the second fitting-portion may be formed at the bus-bar terminal piece 15.

The press-working of the above male projecting portion 17 may be carried out simultaneously with the punching process of the bus-bar pattern 12 and the press-working of the female recessed portion 18 may be carried out simultaneously with the punching process of the bus-bar terminal piece 15.

Subsequently, as shown in FIG. 2 and FIG. 3, the bus-bar pattern 12 formed with the male projecting portion 17 and the bus-bar terminal piece 15 formed with the female recessed portion 18 are electrically connected and secured by so-called TOX connection (connection step).

In the above TOX connection, as shown in FIG. 3, by press-fitting the male projecting portion 17 integrally formed at the bus-bar pattern 12 toward the inside of the female recessed portion 18 integrally formed at the bus-bar terminal piece 15 by a press, the bus-bar pattern 12 and the bus-bar terminal piece 15 are joined to be mechanically secured and electrically connected. Further, the bus-bar terminal piece 15 is joined with the bus-bar pattern 12 by the above connection in a state projecting out from a predetermined position thereof.

According to this method of production, since the bus-bar pattern 12 and the bus-bar terminal piece 15 are connected by press-fitting by a press, the productivity is high and the production costs can be reduced compared with connection by soldering or bolting etc. Also, by carrying out the connection step simultaneously with the bending processing of the tabs 14 etc., the overall time for production can be reduced.

The above embodiment was configured to perform the step of forming the male projecting portion serving as the first fitting portion and the step of molding the female recessed portion 18 serving as the second fitting portion separately, but the invention is not limited to this. It is also possible to adopt the technique, in the step of connecting the bus-bar pattern 12 and the bus-bar terminal piece 15, of superposing the bus-bar pattern 12 and the bus-bar terminal piece 15 taken out from the punching processes and forming recessed portions integrally by press-working, that is, simultaneously forming the male projecting portion 17 and the female recessed portion 18 so as to connect and secure the two.

According to the technique, the trouble for forming the fitting portions separately can be eliminated, the overall process can be simplified, and the two can be more firmly connected.

In the above embodiment, a case was shown of connecting the bus-bar pattern 12 and the bus-bar terminal piece 15 for external connection, however, it is also possible to separately take bus-bar pieces other than the bus-bar terminal piece and connect the bus-bar pieces to the bus-bar pattern by TOX connection.

Figure 8:
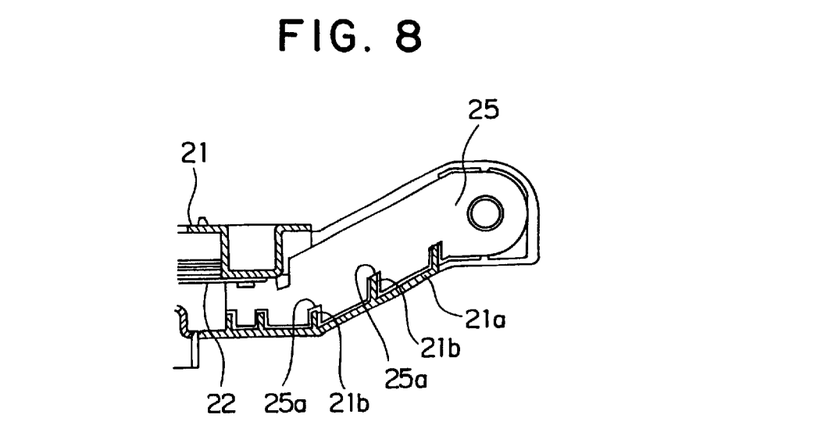
FIG. 8 is a sectional view along the line E2—E2 in FIG. 6.

Also, as shown in FIG. 5 to FIG. 8, in an electric connection box 20 having mount bosses 20a and 20b elongated in one direction at the two ends, the above TOX connection can be even in a case of connecting a bus-bar pattern 22 and a ground terminal piece 25 to be accomodated inside. In this case, when punching out the bus-bar pattern 22 and the ground terminal piece 25 from the conductive metal sheet, as shown in FIG. 8, the ground terminal piece 25 is punched out so that there are a plurality of notches 25a at the periphery of the ground terminal piece 25. Then, the ground terminal piece 25 is arranged so that the ribs 21b formed at the inside of a cover portion 21a projecting out from the case 21 of the electric connection box 20 enter into the notches 25a. By doing so, rattling of the ground terminal piece 25 can be controlled.

Figure 9:
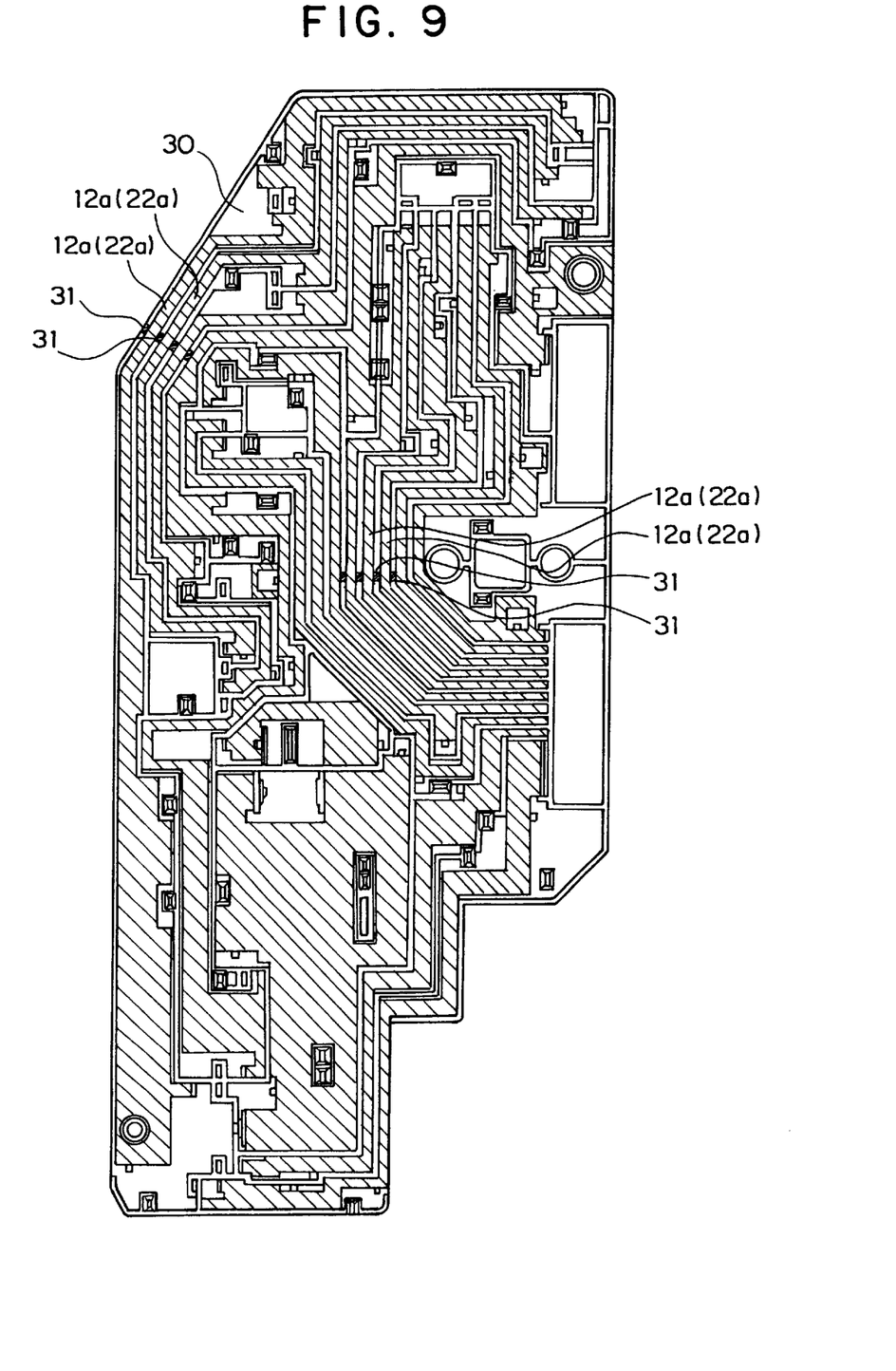
FIG. 9 is a plan view of the state of the bus-bar pattern secured to an insulating board.
Figure 10:
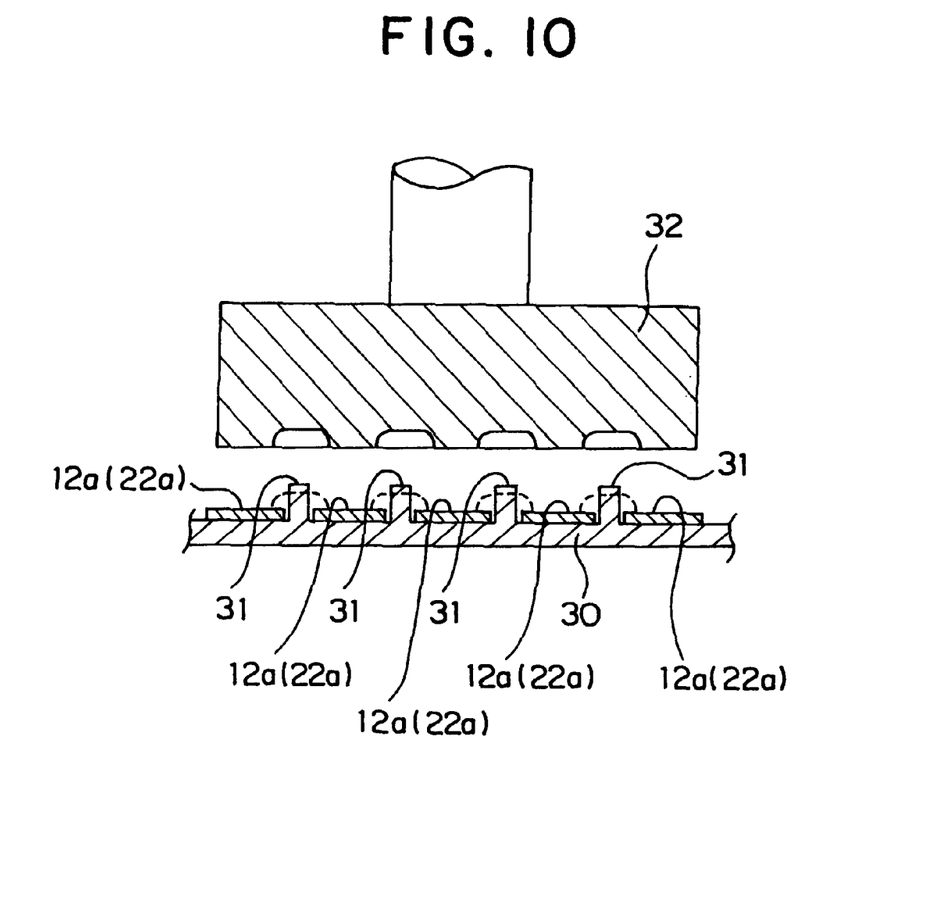
FIG. 10 is a sectional view of a method of securing a bus-bar pattern to an insulating board.

When stacking and securing the above bus-bar pattern 12 (22) on the insulating board, as shown in FIG. 9 and FIG. 10, a plurality of heat bonding bars 31 are provided projecting out from the insulating board 30 so as to be arranged in a row in the perpendicular direction to the longitudinal direction of the plurality of narrow width bus-bars 12a (22a) comprising the bus-bar pattern 12 (22). Then, as shown in FIG. 10, a single ultrasonic wave generator 32 is used for heat bonding all at once so that the heads of the heat bonding bars 31 are pressed wide as shown in FIG. 10.

By doing so, the production process can be simplified and the production costs can be reduced. Further, the bus-bar pattern 12 (22) can be secured to the insulating board 30 in a more stable state.

As explained above, according to the bus-bar wiring board and the method of producing the same of the present invention, since the bus-bar piece is laid out in the remaining vacant space at the time of punching out the bus-bar pattern from the conductive metal sheet and the bus-bar pattern and the bus-bar piece can be separately taken out, a conductive metal sheet of a narrower width than in the past can be used and less material scrap is generated.

As a result, it is possible to reduce the material as much as possible and reduce the production costs. Further, at the time of connecting the separately taken out bus-bar pattern and bus-bar piece, the cost required for the connection can be reduced by using a TOX connection to connect them into one piece—without using rivets, screws or other separate connection means. Further, by carrying out the above TOX connection simultaneously with the bending of the tabs etc., the overall production process can be simplified and the production costs can be reduced.

INDUSTRIAL APPLICABILITY

As explained above, a bus-bar wiring board and a method of production of the same of the present invention result in a lower cost etc. of the product and are especially effective for use for an electric connection box mounted in an automobile or other vehicle.

What is claimed is:

1. A method of producing a bus-bar wiring board comprising a bus-bar pattern (12) and at least one of bus-bar piece (15), the bus-bar pattern having a shape forming a predetermined electric circuit and having either a first male projecting portion (17) or a first female recessed portion, the bus-bar piece having either a second female recessed portion (18) or a second male projecting portion, the first male projection portion (17) and the first recessed portion (18) and /or the second female recessed portion and the second male projecting portion being fitted when assembling, said method comprising the steps of:

laying-out the bus-bar pattern (12) in sheet metal and the bus-bar piece (15) in the vacant space of the sheet metal;

punching out the bus-bar pattern (12) and the bus-bar piece (15);

overlapping the punched-out the bus-bar pattern (12) and the punched out the bus-bar piece (15) at a predetermined position; and fitting the first male projection portion (17) and the first female recessed portion (18) and/or the second recessed portion and the second male projection portion, and pressing the same so that the bus-bar pattern (12) and the bus-bar piece (15) are electrically connected and mechanically secured.

2. The method of producing a bus-bar wiring board as set forth in claim 1, wherein the bus-bar terminal piece punching step is carried out simultaneously with the bus-bar pattern punching step.

3. The method of producing a bus-bar wiring board as set forth in claim 1, wherein:

the bus-bar terminal piece punching step is carried out simultaneously with the bus-bar pattern punching step and, in the connecting step, the bus-bar pattern and the bus-bar terminal piece are superposed and recessed portions are formed integrally by press-working to connect and secure [the two] the bus-bar pattern and the bus-bar terminal piece.

* * * * *